United States Patent
Yun et al.

(10) Patent No.: US 11,929,136 B2
(45) Date of Patent: Mar. 12, 2024

(54) REFERENCE BITS TEST AND REPAIR USING MEMORY BUILT-IN SELF-TEST

(71) Applicant: Siemens Industry Software Inc., Plano, FL (US)

(72) Inventors: Jongsin Yun, Portland, OR (US); Benoit Nadeau-Dostie, Gatineau (CA); Harshitha Kodali, Wilsonville, OR (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/906,303

(22) PCT Filed: Mar. 18, 2021

(86) PCT No.: PCT/US2021/022871
§ 371 (c)(1),
(2) Date: Sep. 14, 2022

(87) PCT Pub. No.: WO2021/194827
PCT Pub. Date: Sep. 30, 2021

(65) Prior Publication Data
US 2023/0178172 A1    Jun. 8, 2023

Related U.S. Application Data

(60) Provisional application No. 63/000,517, filed on Mar. 27, 2020.

(51) Int. Cl.
*G11C 29/54* (2006.01)
*G11C 29/56* (2006.01)

(52) U.S. Cl.
CPC ........ *G11C 29/54* (2013.01); *G11C 29/56004* (2013.01)

(58) Field of Classification Search
None
See application file for complete search history.

(56) References Cited

U.S. PATENT DOCUMENTS

| | | |
|---|---|---|
| 2003/0072204 A1 | 4/2003 | Shiga et al. |
| 2004/0032759 A1 | 2/2004 | Chow et al. |
| | (Continued) | |

FOREIGN PATENT DOCUMENTS

JP    2014220026 A    11/2014

OTHER PUBLICATIONS

PCT International Search Report and Written Opinion of International Searching Authority dated Jul. 6, 2021 corresponding to PCT International Application No. PCT/US2021/022871 filed Mar. 18, 2021.

(Continued)

*Primary Examiner* — Guerrier Merant

(57) ABSTRACT

A memory-testing circuit configured to perform a test of reference bits in a memory. In a read operation, outputs of data bit columns are compared with one or more reference bit columns. The memory-testing circuit comprises: a test controller and association adjustment circuitry configurable by the test controller to associate another one or more reference bit columns or one or more data bit columns with the data bit columns in the read operation. The test controller can determine whether the original one or more reference bit columns have a defect based on results from the two different association.

10 Claims, 10 Drawing Sheets

(56) References Cited

U.S. PATENT DOCUMENTS

| | | |
|---|---|---|
| 2004/0165419 A1 | 8/2004 | Tsuji |
| 2007/0136640 A1* | 6/2007 | Jarrar .................... G11C 29/76 |
| | | 714/763 |
| 2009/0225586 A1 | 9/2009 | Ueda |
| 2017/0110206 A1* | 4/2017 | Ryu .................... G11C 29/4401 |
| 2019/0267072 A1 | 8/2019 | Torng et al. |

OTHER PUBLICATIONS

Artur Antonyan, "28-nm 1T-1MTJ 8Mb 64 I/O STT-MRAM with Symmetric 3-Section Reference Structure and Cross-Coupled Sensing Amplifier" SEC ISCAS, 2017, Korea.

Yi-Chun Shih, "Logic Process Compatible 40-nm 16-Mb, Embedded Perpendicular-MRAM With Hybrid-Resistance Reference, Sub-μA Sensing Resolution, and 17.5-nS Read Access Time", IEEE Journal of Solid-State Circuits, Apr. 2019, pp. 1029-1038, vol. 54, No. 4.

* cited by examiner

REFERENCE BITS TEST AND REPAIR USING MEMORY BUILT-IN SELF-TEST

RELATED APPLICATIONS

This application claims the benefit of U.S. Provisional Patent Application No. 63/000,517, filed on Mar. 27, 2020, which application is incorporated entirely herein by reference.

FIELD OF THE DISCLOSED TECHNIQUES

The presently disclosed techniques relates to memory testing. Various implementations of the disclosed techniques may be particularly useful for improving the manufacturing yield of embedded memories with reference bits.

BACKGROUND OF THE DISCLOSED TECHNIQUES

Magnetoresistive Random Access Memory (MRAM) has become an attractive non-volatile memory solution due to its small size, fast operation speed, and good endurance. MRAM devices can store data in magnetic domains, for example, as a spin polarity of magnets in their free layers. An MRAM device can write data in a magnetic domain by setting the spin polarity of magnets in its free layer, for example, providing a spin-polarized current through Magnetic Tunnel Junction (MTJ), which exerts a torque on local magnetization in the free layer, often called Spin Torque Transfer (STT). The electron spin polarity of these layers switches based on the write-current direction. As a result, the MRAM cell can be switched to either a high resistance state (anti-parallel spin polarity, $R_{AP}$) or a low resistance state (parallel spin polarity, $R_P$).

To read the stored data, the MRAM device can ascertain the spin polarity of the magnets in its free layer relative to a pinned reference layer underneath the corresponding free layer. When the spin polarity is parallel to the pinned reference layer, the resistance on a accessed data bit line (bit column) of the MRAM device can be deemed low and thus correspond to a data "0" value. When the spin polarity is anti-parallel to the pinned reference layer, the resistance on the accessed data bit line of the MRAM device can be deemed high and thus correspond to a data "1" value. The MRAM device can include sensing circuitry to detect the resistance on the accessed data bit line of the MRAM device relative to a reference bit line resistance to determine whether to deem the detected resistance as low corresponding to a data "0" value or as high corresponding to a data "1" value. The resistance detection can be made through current or voltage measurements.

Often a reference bit line is paired with multiple data bit lines for read operations. The reference bit line can be written zeroes or ones. Two reference bit lines stored different values can be used to provide a reference resistance value for a read operation. Thus, each read operation on one of the data bit lines involves an operation on the reference bit line. Frequent operations can make the reference bit line prone to failing. If a reference bit fails, it can cause read operations involving not only one data bit but multiple data bits to fail.

Current high-density semiconductors often include embedded memories. Designed tightly to the technology limits, memories are more prone to failures than other circuits, affecting yield adversely. Built-in self-test (BIST) techniques are employed to identify defects and problems in the memories. Moreover, these circuits usually include built-in self-repair (BISR) circuitry for performing a repair analysis (built-in repair analysis or BIRA) and for replacing faulty elements with spare ones. However, conventional test schemes can only be used to access data bits functionally, but cannot determine whether failures are caused by defects in data bits or reference bits.

Error-correcting code (ECC) techniques is often used in MRAM products. ECC is not only a good solution to fix permanent bit fail problem of memories, but can be used to overcome weak bit aging fault that fails in the early stage of life time. For low fabrication-fault rates (e.g., one or two bit fail in a word), ECC may even eliminate the need for repair circuitry. However, it is very challenging to use ECC to detect and fix defects associated with reference bits because reference bit failure often involve multiple bits and complex ECC coding.

BRIEF SUMMARY OF THE DISCLOSED TECHNIQUES

Various aspects of the disclosed technology relate to test and repair reference bits in a memory. In one aspect, there is a memory-testing circuit in a circuit configured to perform a test of a memory in the circuit, the memory comprising: data bit columns configured to store data bits, reference bit columns configured to store reference bits, and column association circuitry configured to associate one or more of the reference bit columns with a data bit column in the data bit columns, the memory-testing circuit comprising: a test controller, and association adjustment circuitry coupled to the column association circuitry and the test controller, the association adjustment circuitry configurable by the test controller to associate another one or more of the reference bit columns or one or more of the data bit columns with the data bit column in the data bit columns, wherein the test of the memory comprises: performing one or more read operations based on one or more of the reference bit columns associated by the column association circuitry to generate one or more outputs, comparing the one or more outputs with corresponding good-machine values to determine whether any of the one or more outputs is incorrect, if at least one of the one or more outputs is incorrect, repeating at least one of the one or more read operations that generates the at least one of the one or more outputs based on another one or more of the reference bit columns or one or more of the data bit columns which are associated by the association adjustment circuitry to generate at least one second output, and comparing the at least one second output with the corresponding good machine value to determine whether the one or more of the reference bit columns associated by the column association circuitry have a defect.

The memory-testing circuit may further comprise repair circuitry configured to use extra reference bit columns to replace defective reference bit columns detected by the memory-testing circuit. The repair circuitry may comprise: a register coupled to the association adjustment circuitry and configured to load repair information for one or more defective reference columns; an address comparison device configured to compare a data bit column address for a read operation with an address or addresses for data bit columns associated with the one or more defective reference bit columns; and a multiplexing device controlled by an output of the address comparison device and configured to select an output signal from between a signal from the register and a signal from the column association circuitry.

The column association circuitry may be a decoder configured to generate a signal for selecting one or more of the reference bit columns based on an address signal for a read operation.

The memory may be a magnetoresistive random-access memory (MRAM) and a read operation on the memory may comprise comparing an output from a data bit column with outputs from two reference bit columns (storing "0" and "1", respectively) associated with the data bit column, respectively or comparing an output from a data bit column with one half of a sum of outputs from two reference bit columns (storing "0" and "1", respectively) associated with the data bit column.

The association adjustment circuitry may comprise multiplexing circuitry configured to select between an output signal of the column association circuitry and a signal directly from the test controller or produced by a device in the association adjustment circuitry. The device may be configured to add one bit to addresses for the one or more of the reference bit columns associated by the column association circuitry to generate addresses for the another one or more of the reference bit columns.

In another aspect, there are one or more computer-readable media storing computer-executable instructions for causing a computer to perform a method, the method comprising: creating a memory-testing circuit in a circuit design, the circuit design comprising a memory, the memory-testing circuit configured to perform a test of the memory, the memory comprising: data bit columns configured to store data bits, reference bit columns configured to store reference bits, and column association circuitry configured to associate one or more of the reference bit columns with a data bit column in the data bit columns, the memory-testing circuit comprising: a test controller, and association adjustment circuitry coupled to the column association circuitry and the test controller, the association adjustment circuitry configurable by the test controller to associate another one or more of the reference bit columns or one or more of the data bit columns with the data bit column in the data bit columns, wherein the test of the memory comprises: performing one or more read operations based on one or more of the reference bit columns associated by the column association circuitry to generate one or more outputs, comparing the one or more outputs with corresponding good-machine values to determine whether any of the one or more outputs is incorrect, if at least one of the one or more outputs is incorrect, repeating at least one of the one or more read operations that generates the at least one of the one or more outputs based on another one or more of the reference bit columns or one or more of the data bit columns which are associated by the association adjustment circuitry to generate at least one second output, and comparing the at least one second output with the corresponding good machine value to determine whether the one or more of the reference bit columns associated by the column association circuitry have a defect.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

Various aspects of the disclosed technology relate to test and repair reference bits in a memory. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "associate," "compare," and "perform" to describe the disclosed method or the device function/structure. Such terms are high-level descriptions. The actual operations or functions/structures that correspond to these terms will vary depending on the particular implementation and are readily discernible by one of ordinary skill in the art.

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit.

Figure 1:
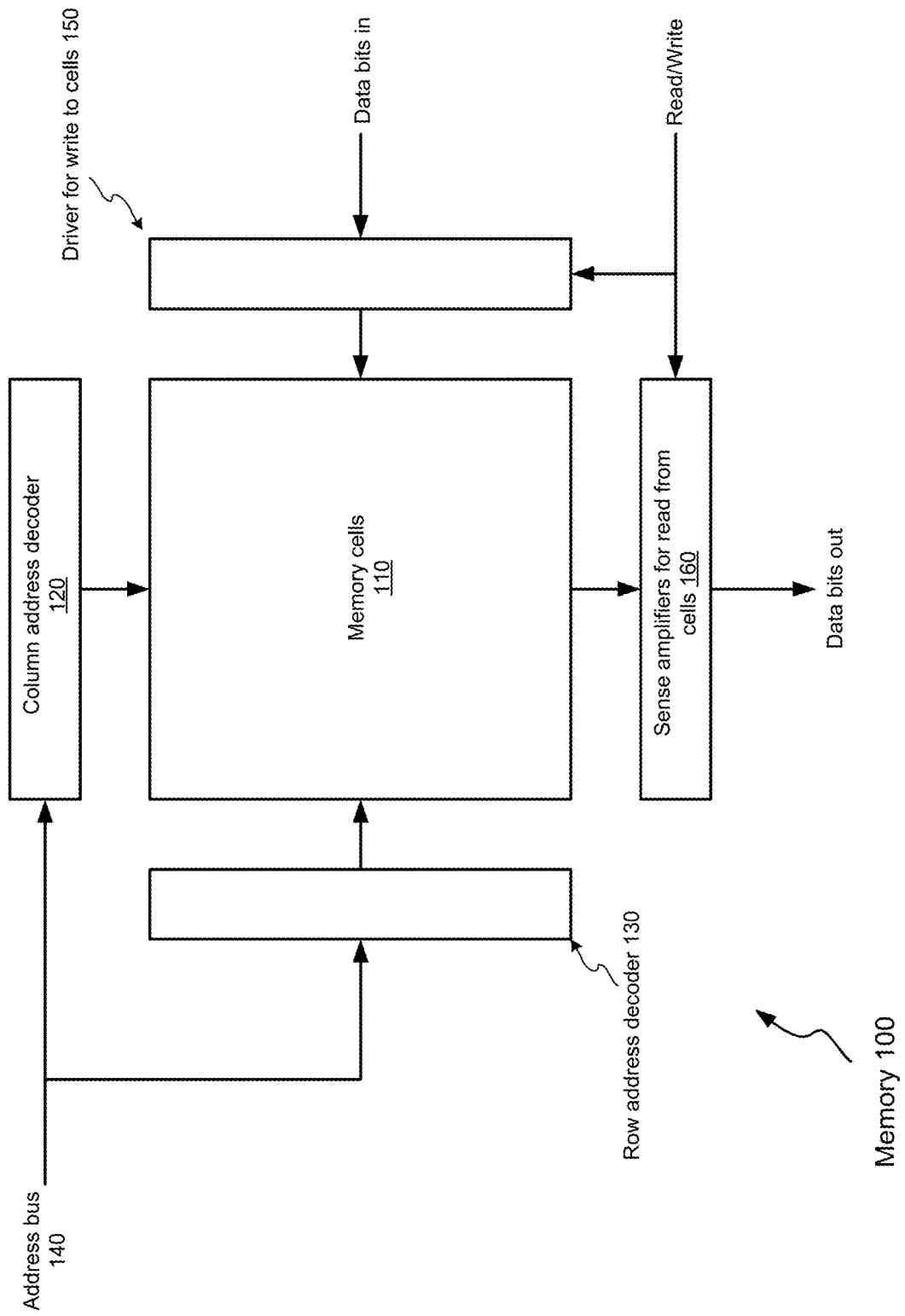
FIG. 1 illustrates an example of a block diagram of a typical memory.

Memories form a large part of system-on-chip circuits. Embedded memories can provide higher bandwidth and consume lower power than stand-alone memories. FIG. 1 illustrates an example of a block diagram of a typical memory 100. The memory 100 comprises memory cells 110, a column address decoder 120, a row address decoder 130, driver circuitry 150, and sense amplifiers 160. The memory cells 110 are connected in a two-dimensional array. Each of the memory cells 110 can store one bit of binary information. The memory cells 110 can be grouped into memory words of fixed word length, for example 1, 2, 4, 8, 16, 32, 64 or 128 bit. A memory cell has two fundamental components: storage node and select device. The storage node stores the data bit for the memory cell, and the select device component facilitates the memory cell to be addressed to read/write in an array.

The row address decoder 130 and the column address decoder 120 determine the cell address that needs to be accessed. Based on the addresses on row address decoder 130 and the column address decoder 120, the corresponding row(s) and column(s) get selected and connected to the sense amplifiers 160. Each of the sense amplifiers 160 amplifies send out a data bit. Similarly, the required cells where the data bits need to be written are selected by the addresses on row address decoder 130 and the column address decoder 120. To write data bits into memory cells, however, the driver 150 is used. The address information is supplied through an address bus 140.

Figure 2:
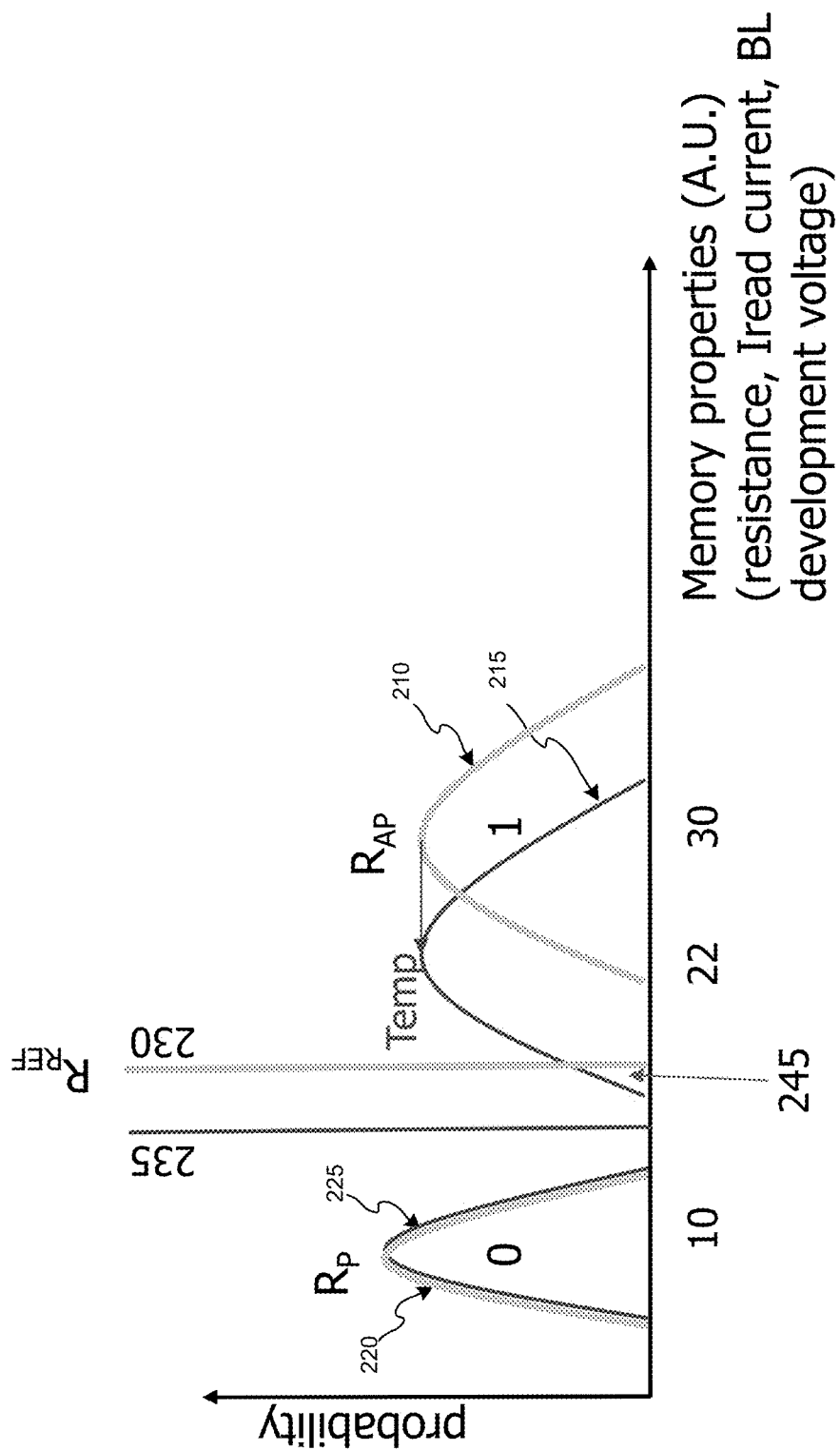
FIG. 2 illustrates an example of resistance distributions of an MRAM array for the "1" state and the "0" state.

For a magnetoresistive random access memory, the sense amplifier 160 determines whether a data bit stores a "0" or "1" by comparing the output from the data bit with a reference value. Due to process variations, the "1" and "0" states of a MRAM has a certain range of resistance distribution similar to a normal distribution. FIG. 2 illustrates an example of resistance distributions of an MRAM array for the "1" state 210/215 and the "0" state 220/225. In the figure, the vertical axis is probability and the horizontal axis is read property. The read property can be resistance, electrical current associated with reading operation, or voltage of the bit line associated with reading operation. It has been reported that the resistance value for the "1" state decreases with an increase of the temperature. In one report, the resistance value for the "0" state 220 stays at ~10 (arbitrary unit) and does not change much with the temperature, whereas the resistance value for the "1" state changes from 30 to 22 (arbitrary unit) when the temperature increases. In FIG. 2, the "1" state 210 is at a high temperature and the "1" state 215 is at a low temperature. If a fixed reference level 230 is used, some memory cells having the resistance values for the "1" state in a region 245 will cause read operations to output errors. To mitigate the problem, some columns in a magnetoresistive random access memory are dedicated to establishing reference resistance 235. These columns are referred to as reference bit columns or reference bit lines. The reference resistance of a reference bit will change with temperature in a way similar to that of a data bit, reducing the chance of the errors caused by the environment. Moreover, process variation caused errors and parasitic effect caused errors can also be reduced when data bits and reference bits share the same word line.

Figure 3:
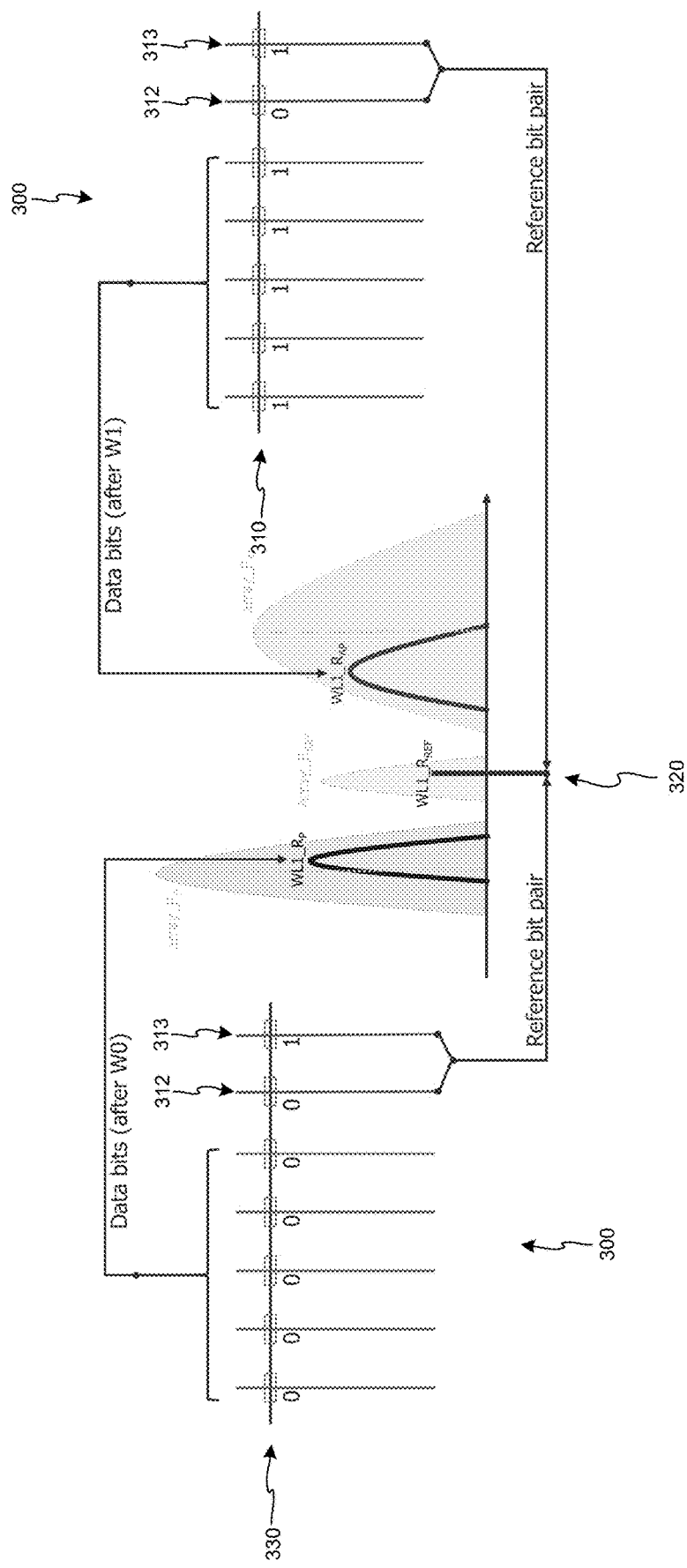
FIG. 3 illustrates an example of multiple data bit columns being associated with a pair of reference bit columns, both of the data bit columns and the reference bit columns being in a memory bank.

FIG. 3 illustrates an example of multiple data bit columns being associated with a pair of reference bit columns 312 and 313, both of the data bit columns and the reference bit columns 312 and 313 being in a memory bank 300. A value of "1" is written into a row of data bit cells 310 in the memory bank 300. The corresponding bit in the reference bit column 312 stores a "0" and the corresponding bit in the reference bit column 313 stores a "1". The average of their resistance values sets the reference resistance value 320. During a read operation, the resistance values of the data bit cells selected from the data bit cells 310 are compared with the reference resistance value 320 to determine the output of the read operation. FIG. 3 shows that they are all greater than the reference resistance value 320 and thus the output of the read operation is set to be "1" for each of the selected data bit cells.

Similarly, a value of "0" is written into a row of data bit cells 330 in the memory bank 300. Again, the corresponding bit in the reference bit column 312 stores a "0" and the corresponding bit in the reference bit column 313 stores a "1". The average of their resistance values sets the reference resistance value 320. During a read operation, the resistance values of the data bit cells selected from the data bit cells 330 are compared with the reference resistance value 320 to determine the output of the read operation. FIG. 3 shows that they are all smaller than the reference resistance value 320 and thus the output of the read operation is set to be "0" for each of the selected data bit cells.

Figure 4:
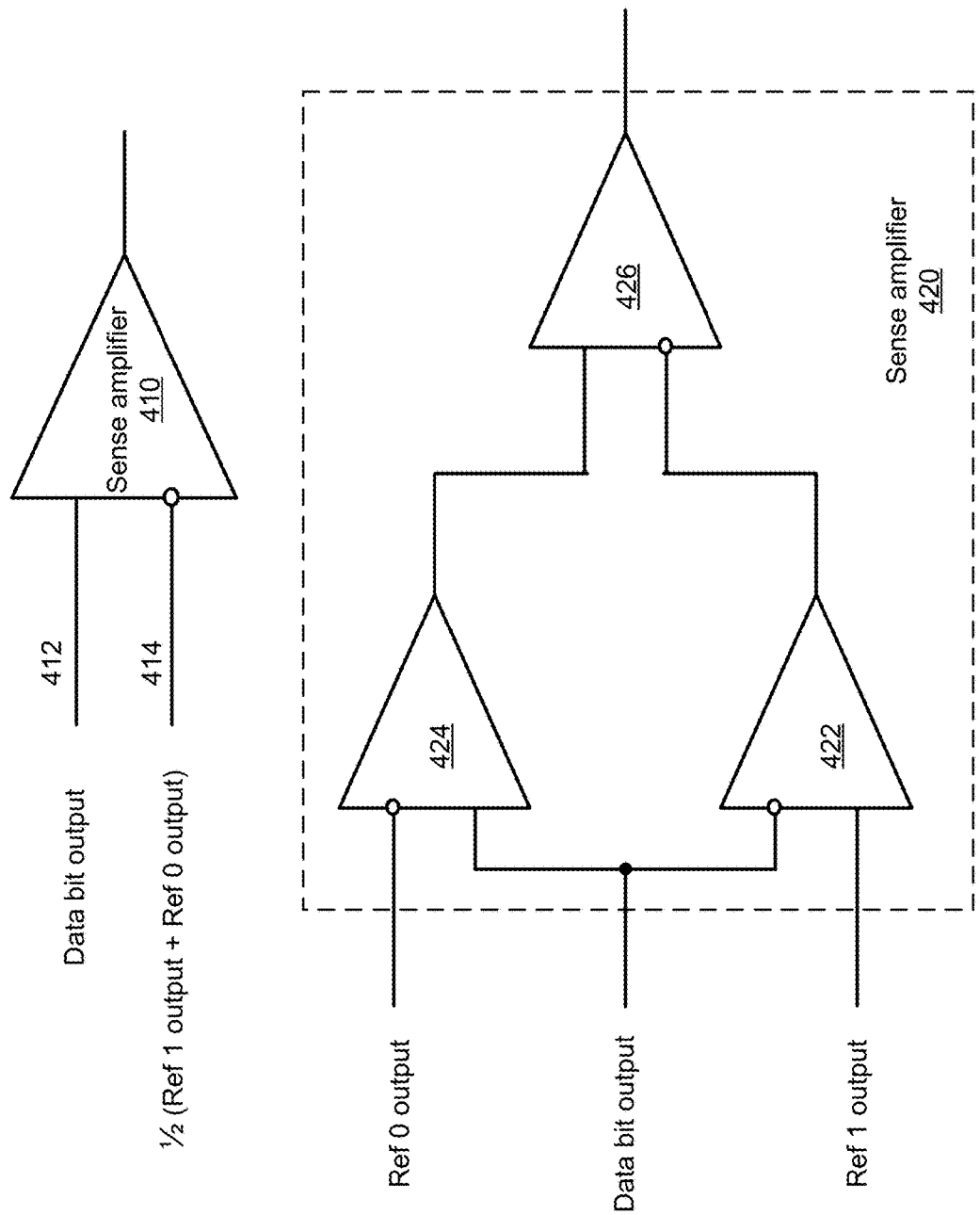
FIG. 4 illustrates examples of two sense amplifiers and which can be used for a magnetoresistive random access memory.

FIG. 4 illustrates examples of two sense amplifiers 410 and 420 which can be used for a magnetoresistive random access memory. The sense amplifier 410 has two inputs 412 and 414. The input 412 is coupled to a current or voltage level corresponding to the resistance of the selected data bit. The input 414 is coupled to a reference voltage/current level corresponding to one half of the sum of the resistance for a reference "0" bit and a reference "1" bit. The sense amplifier 410 compares the two inputs 412 and 414 to determine its output.

Unlike the sense amplifier 410 having a single stage, the sense amplifier 420 has two stages: two sensing devices 422 and 424 at the first stage and one sensing device 426 at the second stage. First, the sensing device 422 compares the current or voltage level corresponding to the resistance of the selected data bit with one corresponding to the reference "1" bit to generate a first intermediate comparison result; and the sensing device 424 compares the current or voltage level corresponding to the resistance of the selected data bit with one corresponding to the reference "0" bit to generate a second intermediate comparison result. Then, the sensing device 426 compares the first intermediate comparison result with the second intermediate comparison result to generate the final output.

For both the sense amplifier 410 and the sense amplifier 420, at least one of the reference "0" bit and the reference "1" bit is from a reference bit column, and the other may be set at a fixed level. Alternatively, a pair of reference bit columns may be employed for the reference "0" bit and the reference "1" bit, respectively.

Figure 5:
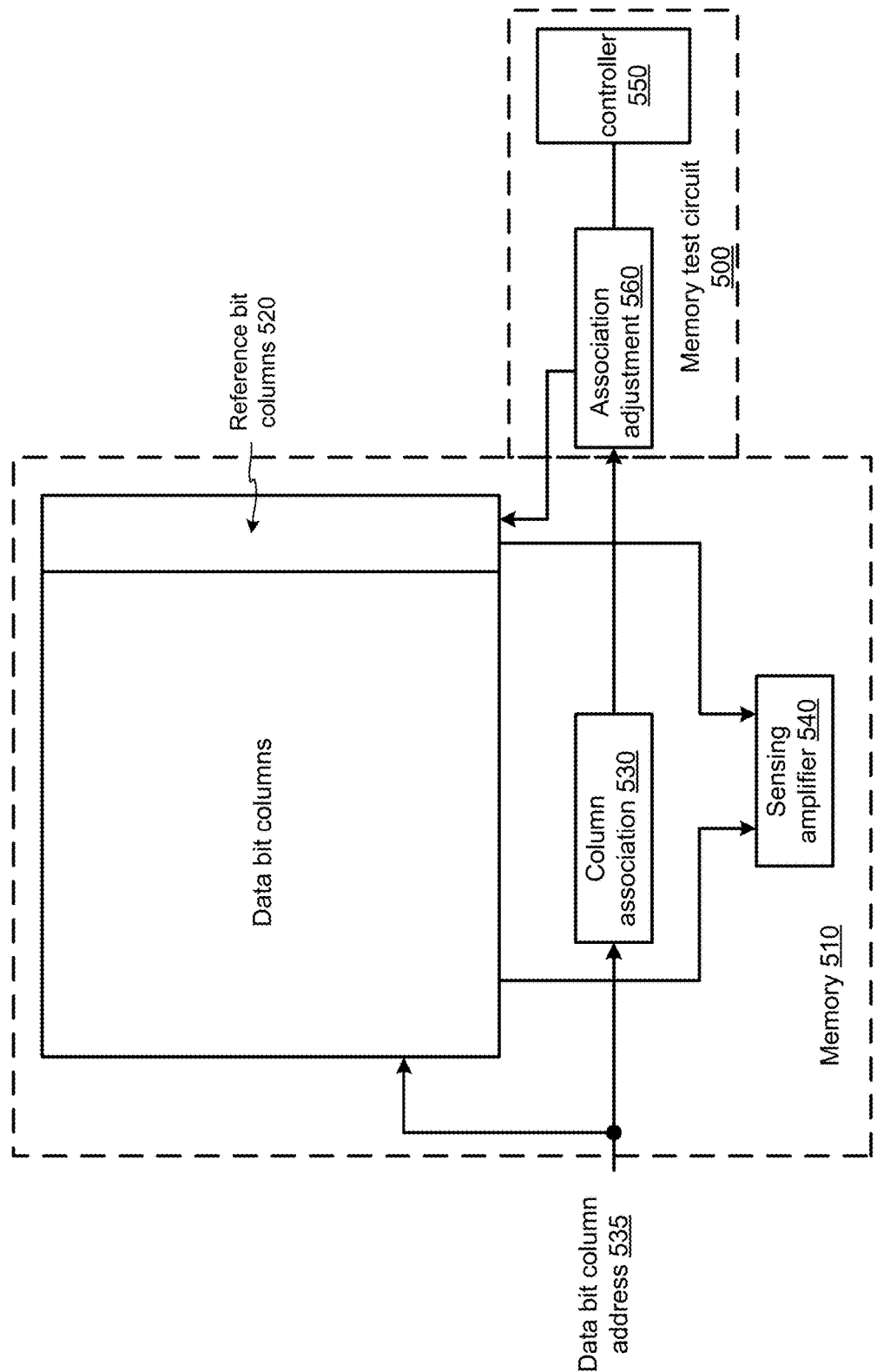
FIG. 5 illustrates an example of a block diagram of a memory-testing circuit that can test reference bits in a memory according to various embodiments of the disclosed technology.

FIG. 5 illustrates an example of a block diagram of a memory-testing circuit 500 that can test reference bits in a memory 510 according to various embodiments of the disclosed technology. The memory 510 comprises data bit columns configured to store data bits and reference bit columns 520 configured to store reference bits. The reference bit columns 520 can be grouped together or separated into subsets with each subset being grouped with some of the data bit columns. The memory 510 also comprises column association circuitry 530 and sense amplifier circuitry 540. In a read operation, the column association circuitry 530 is configured to associate, based on data bit column address information 535, one or more of the reference bit columns 520 with a data bit column in the data bit columns selected by the column address of the read operation, and the sense amplifier circuitry 540 is configured to compare outputs from the selected data bit columns with outputs from the associated reference bit columns to determine the output. An example of the memory 510 is a magnetoresistive random access memory.

Figure 6:
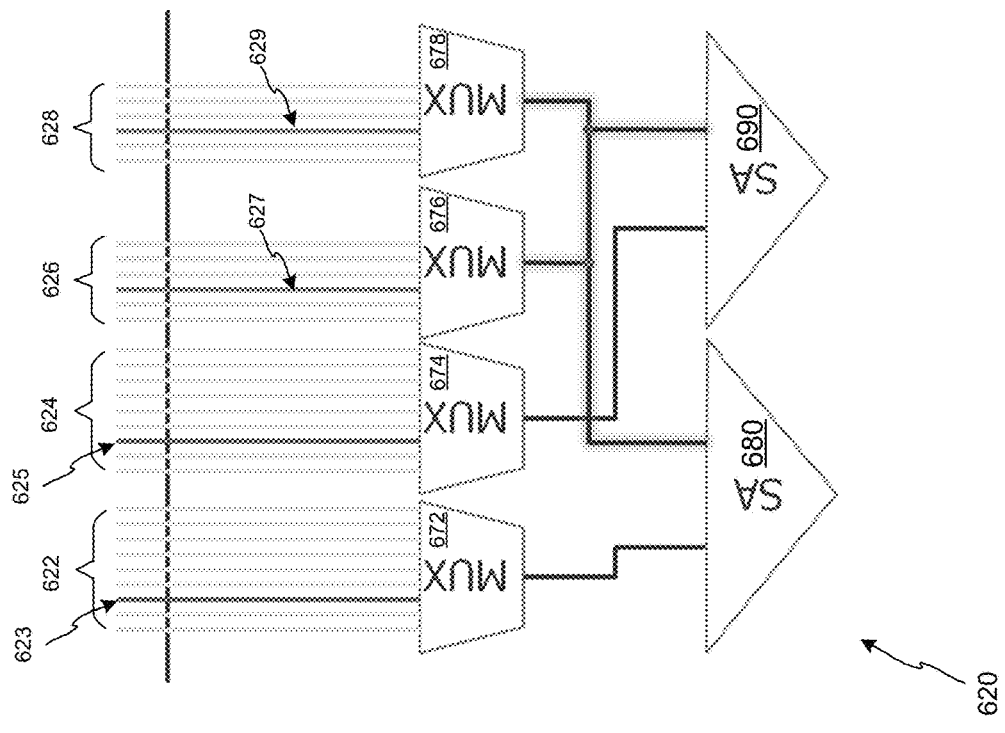
FIG. 6 illustrates two examples of memories having reference bit columns associated with certain data bit columns.
Figure 6:
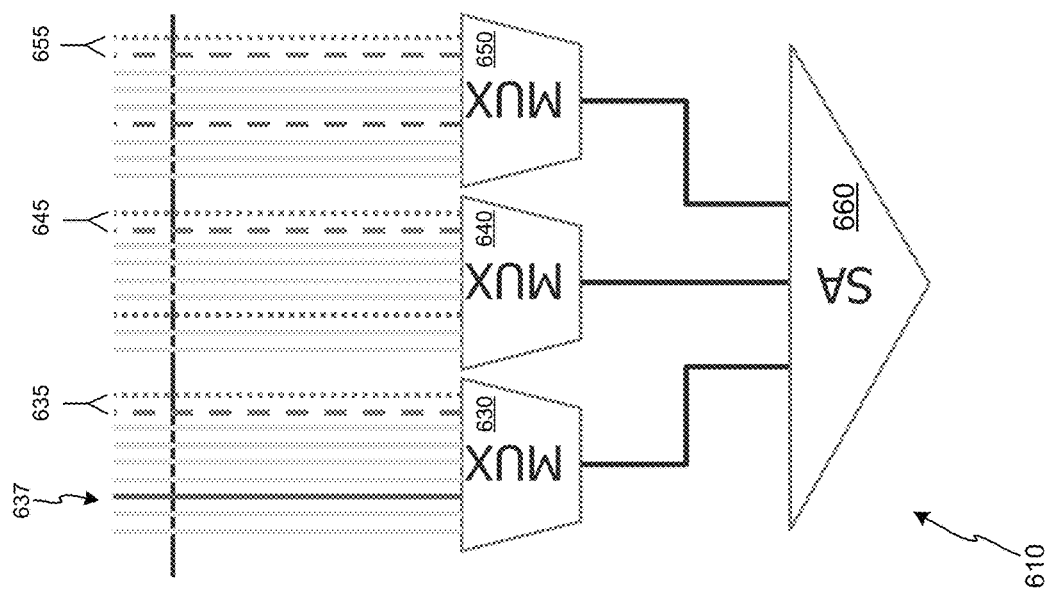

FIG. 6 illustrates examples of memories 610 and 620 having reference bit columns associated with certain data bit columns. The memory 610 is divided into three sections, of which outputs are coupled to three multiplexers 630, 640 and 650, respectively. The outputs of the three multiplexers 630, 640 and 650 are coupled to inputs of a sense amplifier 660. Three pairs of reference bit columns 635, 645 and 655 are in the three sections coupled to the three multiplexers 630, 640 and 650, respectively. It should be noted that each of the three sections may have more than one pair of reference bit columns. In a read operation, for example, a data bit column 637 is selected by the multiplexer 630, one reference bit column in the pair of reference bit columns 645 is selected by the multiplexer 640, and one reference bit column in the pair of reference bit columns 655 is selected by the multiplexer 650. The sense amplifier 660 can use the setup of the sense amplifier 420 shown in FIG. 4 to determine its output based on the three multiplexer outputs.

The memory 620 is divided into four sections 622, 624, 626 and 628, of which outputs are coupled to four multiplexers 672, 674, 676 and 678, respectively. A sense amplifier 680 has its inputs coupled to outputs of the multiplexers 672, 676 and 678. Another sense amplifier 690 has its inputs coupled to outputs of the multiplexers 674, 676 and 678. In the memory 620, the data bit columns and the reference bit columns are separately grouped: the memory sections 622, 624 are used for storing data bits while the memory sections 626, 628 are used for storing reference bits, one for "0" and the other for "1". In a read operation, for example, a data bit column 623 in the section 622 and a data bit column 625 in the section 624 are selected by the multiplexers 672 and 674, respectively, and a reference bit columns 627 in the section 626 and a reference bit columns 629 in the section 628 are selected by the multiplexers 676 and 678, respectively. The sense amplifiers 680 and 690 can use the setup of the amplifier 410 shown in FIG. 4 to compare the corresponding multiplexer outputs to determine their outputs.

Figure 7:
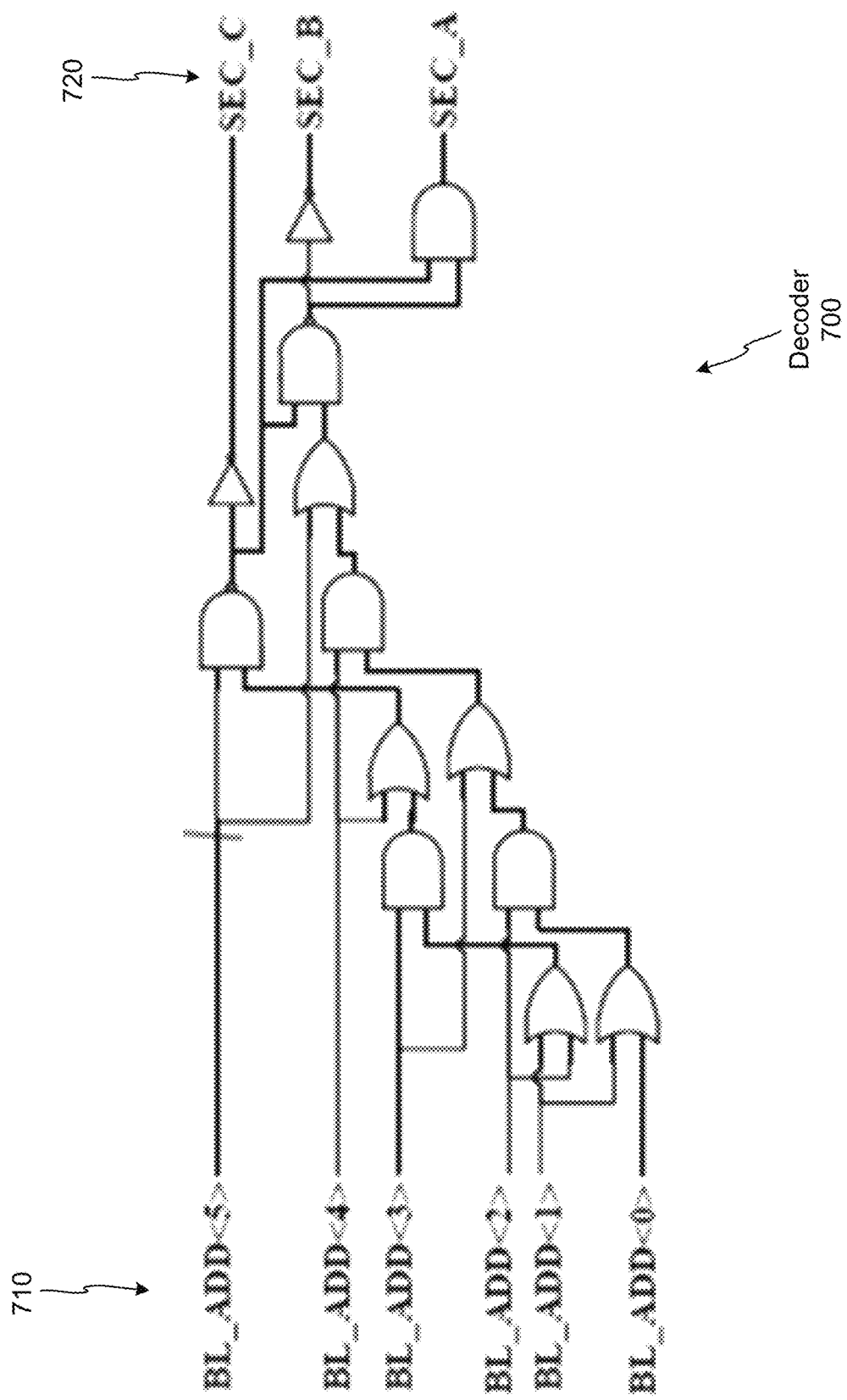
FIG. 7 illustrates an example of a decoder.

Referring back to FIG. 5, the column association circuitry 530 can be a decoder configured to generate a signal for selecting one or more of the reference bit columns from a column address signal for a read operation. FIG. 7 illustrates an example of a decoder 700. The decoder 700 comprises logic gates. The inputs of the decoder 700 receive six address bits 710 (BL_ADD<0:5>) for selecting data bit columns. These input address bits 710 can select one of 64 data bit columns in each I/O unit. Three output signals 720 of the decoder 700 can be used to select the reference bit columns.

Referring back to FIG. 5, the memory-testing circuit 500 comprises a test controller 550 and association adjustment circuitry 560. The test controller 550 may be implemented by a conventional memory BIST controller. The test controller 550 can be programmed by signals sent via a TAP (test access port) and execute a test by applying a sequence of reads and writes to memory cells in the memory 510 via a test interface. Such a sequence of reads and writes is often referred to as a memory test algorithm. The association adjustment circuitry 560 is coupled to the column association circuitry 530 and the test controller 550, respectively. Based on a control signal from the test controller 550, the association adjustment circuitry 560 can, during a read operation, either allow a signal outputted by the column association circuitry 530 to go through to select reference bit columns, or to output a signal to associate different reference bit columns or data bit columns with the selected data bit columns. It should be noted that the association adjustment circuitry 560 can be considered as a device inside the memory 510.

During a test, the test controller 550 may perform some write operations and read operations on the memory 510. The read operations are based on the reference bit columns associated by the column association circuitry 530 to generate outputs. The outputs are compared with corresponding good-machine values (expected values) to determine whether any of the one or more outputs is incorrect. If at least one of the one or more outputs is incorrect for the tested rows associated with specific reference bit or bit pairs, the test controller 550 will repeat at least one of the one or more read operations. But the outputs of the at least one of the one or more read operations are obtained not based on the originally associated reference bit columns but based on reference bit columns or even data bit columns associated by the association adjustment circuitry 560. The new outputs are compared again with the corresponding good-machine values. These newly associated reference bit columns or data bit columns may be selected from the reference bit columns or data bit columns known to have no defect. As such, the test controller 550 can determine that the originally associated reference bit columns has a defect if the new outputs match the corresponding good-machine values or that the data bits have a defect if the new outputs do not match the corresponding good-machine values.

Figure 8:
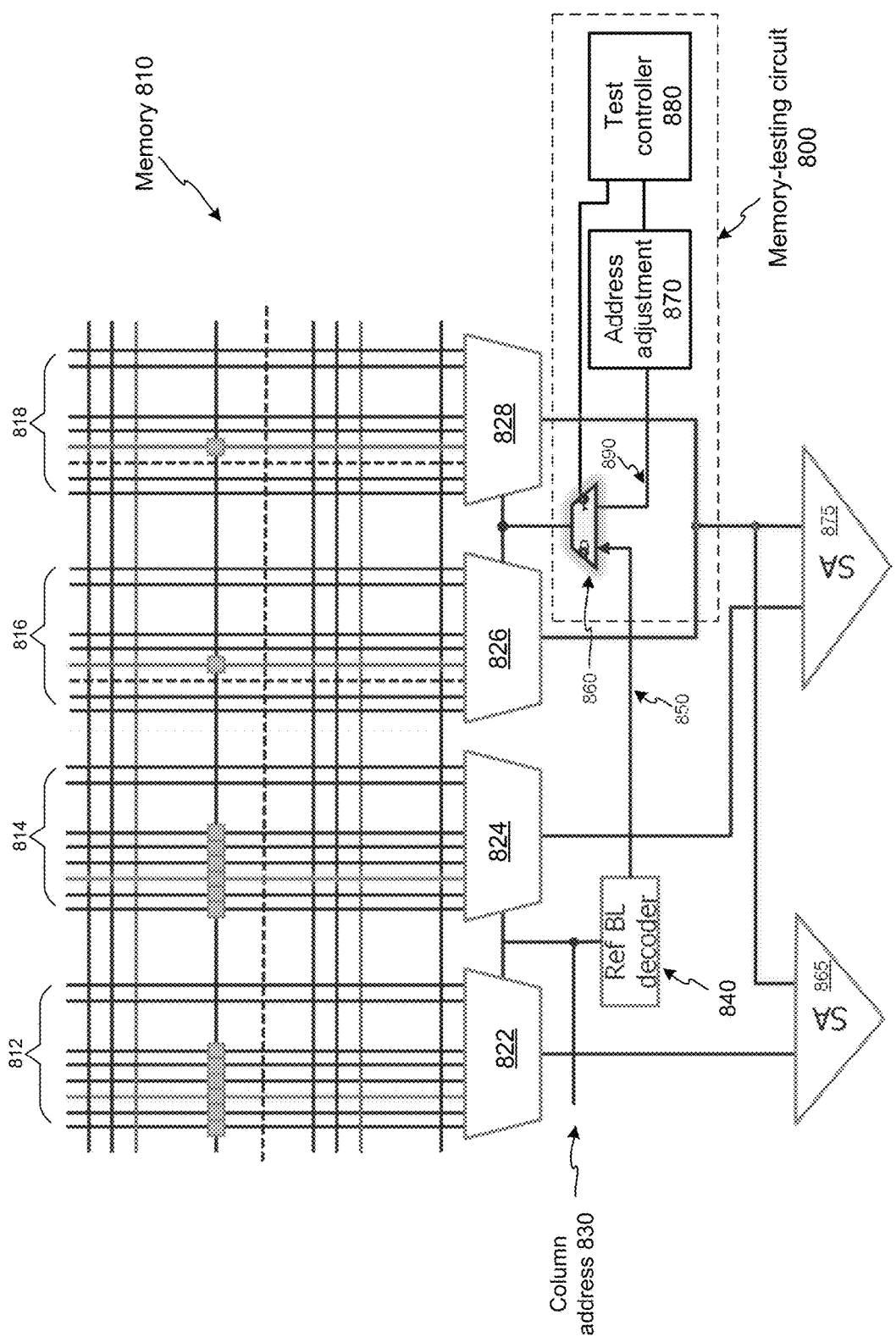
FIG. 8 illustrates an example of how a memory-testing circuit tests reference bits in a memory according to some embodiments of the disclosed technology.

FIG. 8 illustrates an example of how a memory-testing circuit 800 tests reference bits in a memory 810 according to some embodiments of the disclosed technology. The memory 810 groups columns into four sections 812, 814, 816 and 818. The sections 812 and 814 are configured to store data bits and thus comprise data bit columns, and the sections 816 and 818 are configured to store reference bits and thus comprise reference bit columns. The column outputs in the four sections 812, 814, 816 and 818 are selected by multiplexers 822, 824, 826 and 828, respectively. A column address signal 830 is used by the multiplexers 822 and 824 to select data bit columns. A decoder 840 generates a reference column selection signal 850 based on the column address signal 830. The reference column selection signal 850 controls the multiplexers 826 and 828 for selecting reference bit columns. The memory 810 also has two sense amplifiers 865 and 875, which use a combination of the outputs of the multiplexers 826 and 828 as a reference to derive its output. The combination can be one half of the sum of the outputs of the multiplexers 826 and 828. The sense amplifier 865 compares the output of the multiplexer 822 with a reference level obtained based on the combination of the outputs of the multiplexers 826 and 828 to derive its output, and the sense amplifier 875 compares the output of the multiplexer 824 with the reference level obtained based on the combination of the outputs of the multiplexers 826 and 828 to derive its output.

The memory-testing circuit 800 comprises a selection device 860, an address adjustment device 870, and a test controller 880. The selection device 860 and the address adjustment device 870 can be considered as part of the association adjustment circuitry 560 in FIG. 5. The address adjustment device 870 is configured to shift the reference column selection signal 850 by one bit to generate a new reference column selection signal 890. The test controller 880 can control the selection device 860, dictating whether the reference column selection signal 850 or the new reference column selection signal 890 is allowed to control the multiplexers 826 and 828. During a test, if outputs of one or more read operations based on the reference column selection signal 850 has errors, but if outputs of the same one or more read operations based on the new reference column selection signal 890 has no errors, the test controller 880 will determine that the reference bit columns selected by the reference column selection signal 850 probably has a defect. Shifting the reference bit column address by one bit is only one of many ways to generate the new reference bit column address 890. The test controller 880 can directly supply the new reference bit column address 890.

Figure 9:
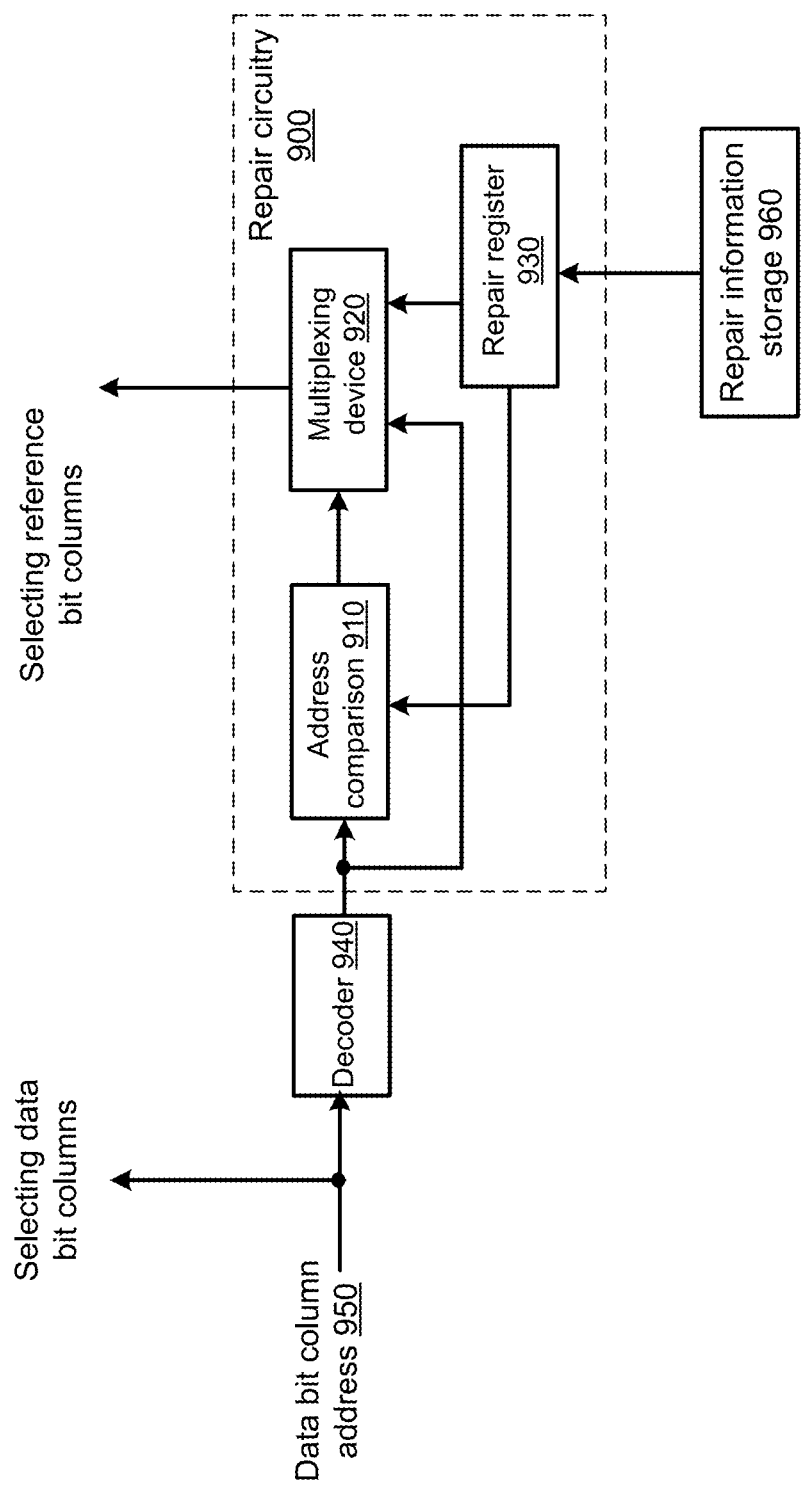
FIG. 9 illustrates an example of repair circuitry that may be included in a memory-testing circuit according to various embodiments of the disclosed technology.

FIG. 9 illustrates an example of repair circuitry 900 that may be included in a memory-testing circuit according to various embodiments of the disclosed technology. The repair circuitry 900 comprises an address comparison device 910, a multiplexing device 920, and a repair register 930. The repair solution for reference bit columns is typically stored along with other repair solutions in a repair information storage device 960. The repair information storage device 960 can be a fuse array, one-time programmable memory, and other non-volatile storage. To save space, these repair solutions are often stored in a compressed form. Upon a circuit power-up or reset, the compressed repair solution is automatically decompressed and scanned into the repair register 930 via a scan chain. The address comparison device 910 is configured to compare, during a read operation, a reference data bit column address signal outputted from a decoder 940 with an address or addresses supplied by the repair register 930. The decode 940, like the column association circuitry 530 in FIG. 5, is configured to generate, based on a data bit column address signal 950, the reference data bit column address signal to associate one or more reference bit columns with the data bit column selected by the data bit column address signal 950.

If the address comparison device 910 finds no match between the reference data bit column address signal from the decoder 940 and the address or addresses from the repair register 930, the former is allowed to pass through the multiplexing device 920. Otherwise, a different reference bit column address supplied by the repair register 930 is allowed to pass through the multiplexing device 920. The different reference bit column address can be an address for a redundant reference bit column dedicated for repair.

Figure 10:
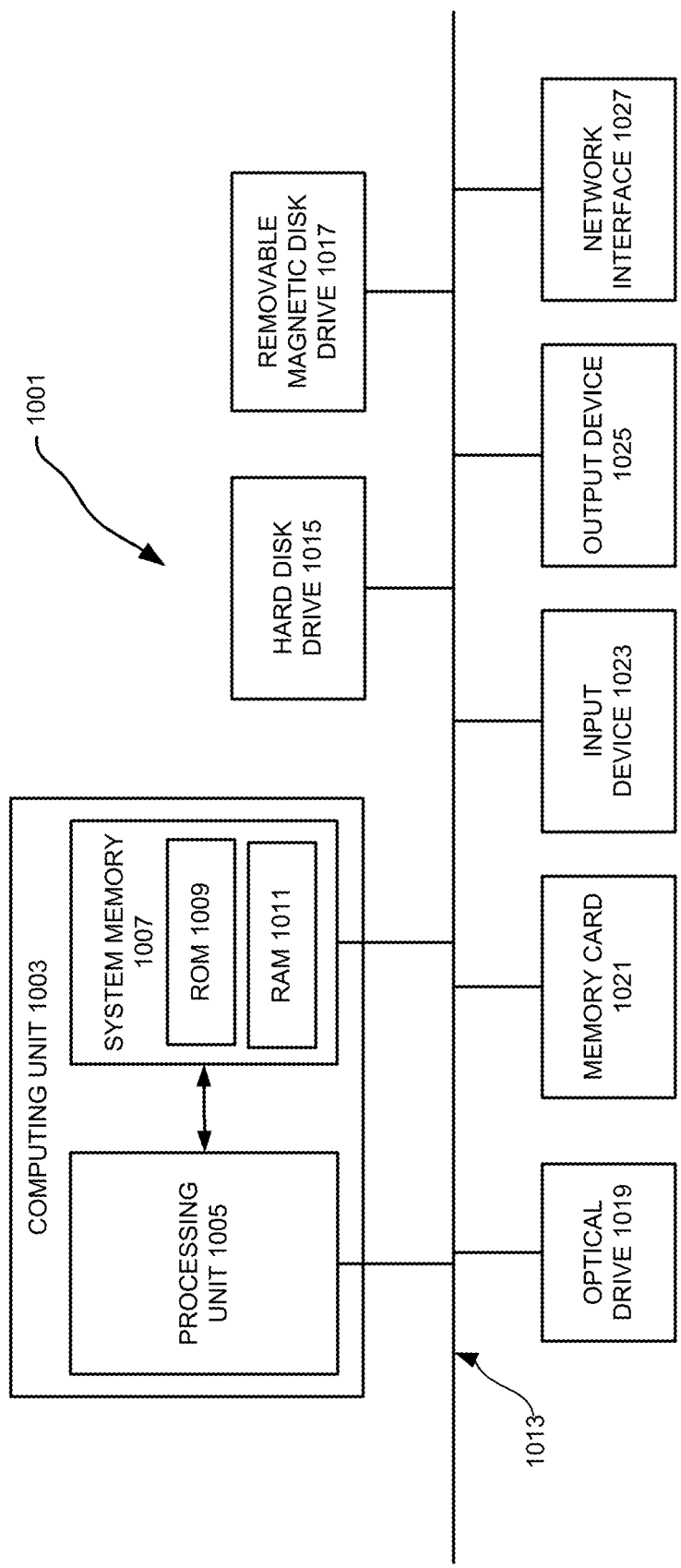
FIG. 10 illustrates an example of a programmable computer system with which various embodiments of the disclosed technology may be employed.

Various examples of the disclosed technology may be implemented through the execution of software instructions by a computing device, such as a programmable computer. Accordingly, FIG. 10 shows an illustrative example of a computing device 1001. As seen in this figure, the computing device 1001 includes a computing unit 1003 with a processing unit 1005 and a system memory 1007. The processing unit 1005 may be any type of programmable electronic device for executing software instructions, but it will conventionally be a microprocessor. The system memory 1007 may include both a read-only memory (ROM) 1009 and a random access memory (RAM) 1011. As will be appreciated by those of ordinary skill in the art, both the read-only memory (ROM) 1009 and the random access memory (RANI) 1011 may store software instructions for execution by the processing unit 1005.

The processing unit 1005 and the system memory 1007 are connected, either directly or indirectly, through a bus 1013 or alternate communication structure, to one or more peripheral devices. For example, the processing unit 1005 or the system memory 1007 may be directly or indirectly connected to one or more additional memory storage devices, such as a "hard" magnetic disk drive 1015, a removable magnetic disk drive 1017, an optical disk drive 1019, or a flash memory card 1021. The processing unit 1005 and the system memory 1007 also may be directly or indirectly connected to one or more input devices 1023 and one or more output devices 1025. The input devices 1023 may include, for example, a keyboard, a pointing device (such as a mouse, touchpad, stylus, trackball, or joystick), a scanner, a camera, and a microphone. The output devices 1025 may include, for example, a monitor display, a printer and speakers. With various examples of the computer 1001, one or more of the peripheral devices 1015-1025 may be internally housed with the computing unit 1003. Alternately, one or more of the peripheral devices 1015-1025 may be external to the housing for the computing unit 1003 and connected to the bus 1013 through, for example, a Universal Serial Bus (USB) connection.

With some implementations, the computing unit 1003 may be directly or indirectly connected to one or more network interfaces 1027 for communicating with other devices making up a network. The network interface 1027 translates data and control signals from the computing unit 1003 into network messages according to one or more communication protocols, such as the transmission control protocol (TCP) and the Internet protocol (IP). Also, the interface 1027 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 1001 is illustrated as an example only, and it is not intended to be limiting. Various embodiments of the disclosed technology may be implemented using one or more computing devices that include the components of the computer 1001 illustrated in FIG. 10, which include only a subset of the components illustrated in FIG. 10, or which include an alternate combination of components, including components that are not shown in FIG. 10. For example, various embodiments of the disclosed technology may be implemented using a multi-processor computer, a plurality of single and/or multiprocessor computers arranged into a network, or some combination of both.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A memory-testing circuit in a circuit configured to perform a test of a memory in the circuit, the memory comprising: data bit columns configured to store data bits, reference bit columns configured to store reference bits, and column association circuitry configured to associate one or more of the reference bit columns with a data bit column in the data bit columns, the memory-testing circuit comprising:
a test controller;
association adjustment circuitry coupled to the column association circuitry and the test controller, the association adjustment circuitry configurable by the test controller to associate another one or more of the reference bit columns or one or more of the data bit columns with the data bit column in the data bit columns; and
repair circuitry configured to use extra reference bit columns to replace defective reference bit columns detected by the memory-testing circuit, the repair circuitry comprises:
a register coupled to the association adjustment circuitry and configured to load repair information for one or more defective reference columns,
an address comparison device configured to compare a data bit column address for a read operation with an address or addresses for data bit columns associated with the one or more defective reference bit columns, and
a multiplexing device controlled by an output of the address comparison device and configured to select an output signal from between a signal from the register and a signal from the column association circuitry,
wherein the test of the memory comprises:
performing one or more read operations based on one or more of the reference bit columns associated by the column association circuitry to generate one or more outputs,
comparing the one or more outputs with corresponding good-machine values to determine whether any of the one or more outputs is incorrect,
if at least one of the one or more outputs is incorrect, repeating at least one of the one or more read operations that generates the at least one of the one or more outputs based on another one or more of the reference bit columns or one or more of the data bit columns which are associated by the association adjustment circuitry to generate at least one second output, and
comparing the at least one second output with the corresponding good machine value to determine whether the one or more of the reference bit columns associated by the column association circuitry have a defect.

2. The memory-testing circuit recited in claim 1, wherein the column association circuitry is a decoder configured to generate a signal for selecting one or more of the reference bit columns based on an address signal for a read operation.

3. The circuit recited in claim 1, wherein the memory is a magnetoresistive random-access memory (MRAM) and a read operation on the memory comprises comparing an output from a data bit column with outputs from two reference bit columns (storing "0" and "1", respectively) associated with the data bit column, respectively or comparing an output from a data bit column with one half of a sum of outputs from two reference bit columns (storing "0" and "1", respectively) associated with the data bit column.

4. The circuit recited in claim 1, wherein the association adjustment circuitry comprises multiplexing circuitry configured to select between an output signal of the column association circuitry and a signal directly from or produced based on a signal from the test controller.

5. The circuit recited in claim 4, wherein the device is configured to add one bit to addresses for the one or more of the reference bit columns associated by the column association circuitry to generate addresses for the another one or more of the reference bit columns.

6. One or more computer-readable media storing computer-executable instructions for causing a computer to perform a method, the method comprising:
creating a memory-testing circuit in a circuit design, the circuit design comprising a memory, the memory-testing circuit configured to perform a test of the memory, the memory comprising: data bit columns configured to store data bits, reference bit columns configured to store reference bits, and column association circuitry configured to associate one or more of the reference bit columns with a data bit column in the data bit columns, the memory-testing circuit comprising:
a test controller;
association adjustment circuitry coupled to the column association circuitry and the test controller, the association adjustment circuitry configurable by the test controller to associate another one or more of the reference bit columns or one or more of the data bit columns with the data bit column in the data bit columns; and
repair circuitry configured to use extra reference bit columns to replace defective reference bit columns detected by the memory-testing circuit, the repair circuitry comprises:
a register coupled to the association adjustment circuitry and configured to load repair information for one or more defective reference columns,
an address comparison device configured to compare a data bit column address for a read operation with an address or addresses for data bit columns associated with the one or more defective reference bit columns, and
a multiplexing device controlled by an output of the address comparison device and configured to select an output signal from between a signal from the register and a signal from the column association circuitry,
wherein the test of the memory comprises:
performing one or more read operations based on one or more of the reference bit columns associated by the column association circuitry to generate one or more outputs,
comparing the one or more outputs with corresponding good-machine values to determine whether any of the one or more outputs is incorrect,
if at least one of the one or more outputs is incorrect, repeating at least one of the one or more read operations that generates the at least one of the one or more outputs based on another one or more of the reference bit columns or one or more of the data bit columns which are associated by the association adjustment circuitry to generate at least one second output, and comparing the at least one second output with the corresponding good machine value to determine whether the one or more of the reference bit columns associated by the column association circuitry have a defect.

7. The one or more computer-readable media recited in claim 6, wherein the column association circuitry is a decoder configured to generate a signal for selecting one or more of the reference bit columns based on an address signal for a read operation.

8. The one or more computer-readable media recited in claim 6, wherein the memory is a magnetoresistive random-access memory (MRAM) and a read operation on the memory comprises comparing an output from a data bit column with outputs from two reference bit columns (storing "0" and "1", respectively) associated with the data bit column, respectively or comparing an output from a data bit column with one half of a sum of outputs from two reference bit columns (storing "0" and "1", respectively) associated with the data bit column.

9. The one or more computer-readable media recited in claim 6, wherein the association adjustment circuitry comprises multiplexing circuitry configured to select between an output signal of the column association circuitry and a signal directly from or produced based on a signal from the test controller.

10. The one or more computer-readable media recited in claim 9, wherein the device is configured to add one bit to addresses for the one or more of the reference bit columns associated by the column association circuitry to generate addresses for the another one or more of the reference bit columns.

* * * * *